United States Patent
Kumar et al.

(10) Patent No.: US 12,412,110 B2
(45) Date of Patent: Sep. 9, 2025

(54) SYSTEMS AND METHODS FOR MACHINE LEARNING BASED RISKY CIRCUIT PATTERN IDENTIFICATION

(71) Applicant: ANSYS, INC., Canonsburg, PA (US)

(72) Inventors: Akhilesh Kumar, Milpitas, CA (US); Hui Ding, Los Altos, CA (US); Norman Chang, Fremont, CA (US)

(73) Assignee: ANSYS, INC., Canonsburg, PA (US)

( * ) Notice: Subject to any disclaimer, the term of this patent is extended or adjusted under 35 U.S.C. 154(b) by 1213 days.

(21) Appl. No.: 16/580,168

(22) Filed: Sep. 24, 2019

(65) Prior Publication Data

US 2020/0202244 A1 Jun. 25, 2020

Related U.S. Application Data

(60) Provisional application No. 62/783,980, filed on Dec. 21, 2018.

(51) Int. Cl.
*G06N 20/00* (2019.01)
*G06F 30/327* (2020.01)
*G06N 5/047* (2023.01)

(52) U.S. Cl.
CPC ............ *G06N 5/047* (2013.01); *G06F 30/327* (2020.01); *G06N 20/00* (2019.01)

(58) Field of Classification Search
CPC .......... G06N 5/047; G06N 20/00; G06N 3/08; G06N 20/20; G06N 5/003; G06F 30/327; G06F 30/27; C07D 471/06; G05F 1/625; H01L 29/66712; H01L 29/511
See application file for complete search history.

(56) References Cited

U.S. PATENT DOCUMENTS

| | | | |
|---|---|---|---|
| 10,699,051 B1* | 6/2020 | Zhang | G06F 30/392 |
| 2006/0041417 A1* | 2/2006 | Palladino | G06F 11/261 |
| | | | 714/E11.167 |
| 2007/0198958 A1* | 8/2007 | Tang | G06F 30/398 |
| | | | 716/112 |
| 2010/0131908 A1* | 5/2010 | Krishnan | G06F 30/30 |
| | | | 716/136 |
| 2010/0169845 A1* | 7/2010 | Boselli | G06F 30/30 |
| | | | 716/132 |
| 2013/0007549 A1* | 1/2013 | Chan | G06F 11/261 |
| | | | 714/E11.167 |

(Continued)

OTHER PUBLICATIONS

Fault modeling and diagnosis for nanometric analog circuits Hauang, IEEE, 978-1-4799-0859 (Year: 2013).*

(Continued)

*Primary Examiner* — David R Vincent
(74) *Attorney, Agent, or Firm* — WOMBLE BOND DICKINSON (US) LLP

(57) ABSTRACT

Machine assisted systems and methods for detecting unreliable circuit patterns are described. These systems and methods can use a machine learning classifier, that has been trained to recognize such circuit patterns, to detect the unreliable circuit patterns without requiring computationally expensive simulations of a circuit netlist which can be over a million devices (e.g. over a million FETs). The classifier, once trained, can recognize unreliable circuit patterns quickly and can be updated over time as new unreliable circuit patterns are discovered from simulations or other sources.

21 Claims, 10 Drawing Sheets

(56) References Cited

U.S. PATENT DOCUMENTS

| | | | |
|---|---|---|---|
| 2013/0325389 A1* | 12/2013 | Wu | G01R 31/2812 |
| | | | 702/117 |
| 2015/0016709 A1* | 1/2015 | Toyoda | G06T 7/0008 |
| | | | 382/149 |
| 2016/0117436 A1* | 4/2016 | Ng | G06F 30/327 |
| | | | 716/113 |
| 2016/0253445 A1* | 9/2016 | Pataky | G06F 30/327 |
| | | | 716/104 |
| 2017/0032075 A1* | 2/2017 | Juang | G06F 30/398 |

OTHER PUBLICATIONS

Impact of Small Process Geometries on Microarchitectures in Systems on a Chip: Sylvester, IEEE 0018-9219/01 2001 (Year: 2001).*

* cited by examiner

USE OF TRAINED CLASSIFIER

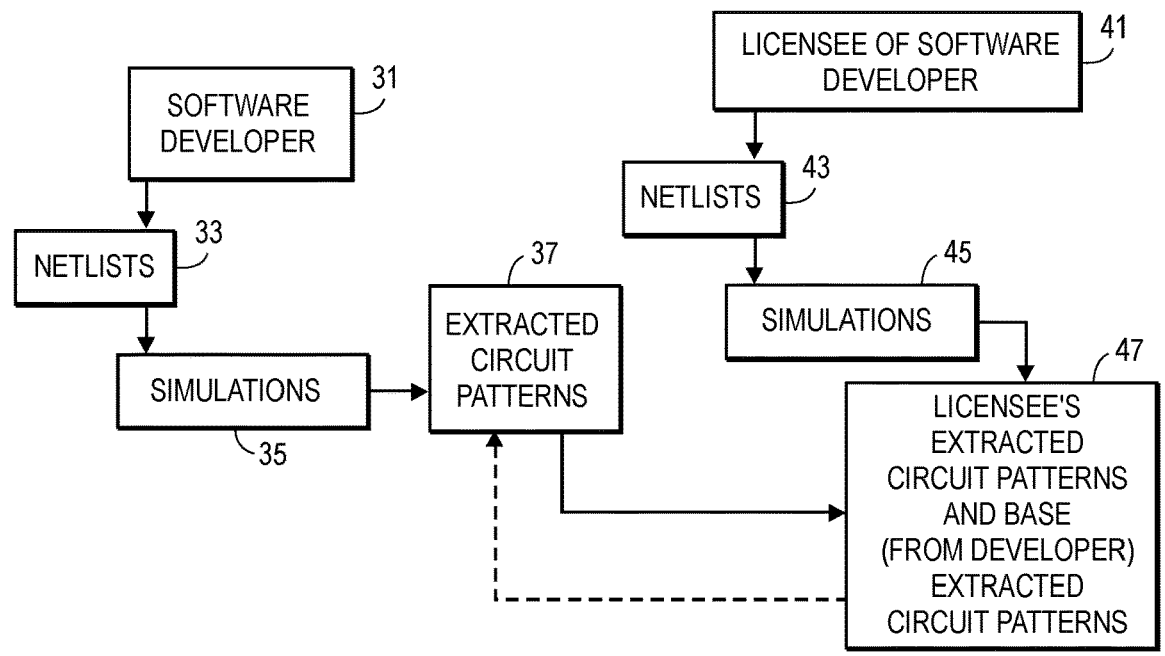
FIG. 1C
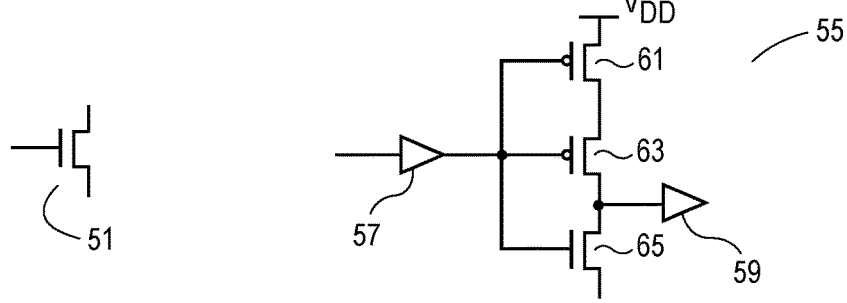
FIG. 2A  FIG. 2B
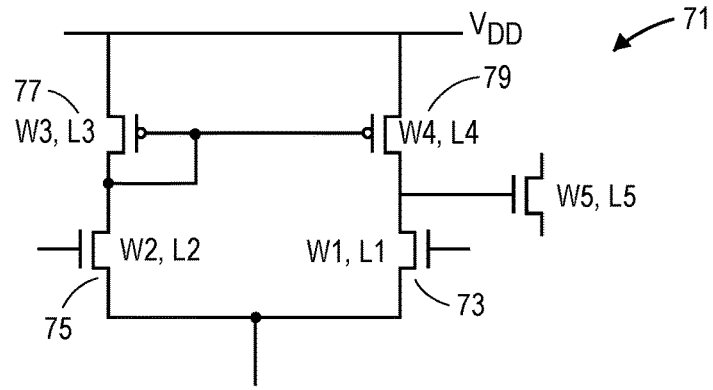
FIG. 3

VARIATION GENERATION

TRAINING OF CLASSIFIER

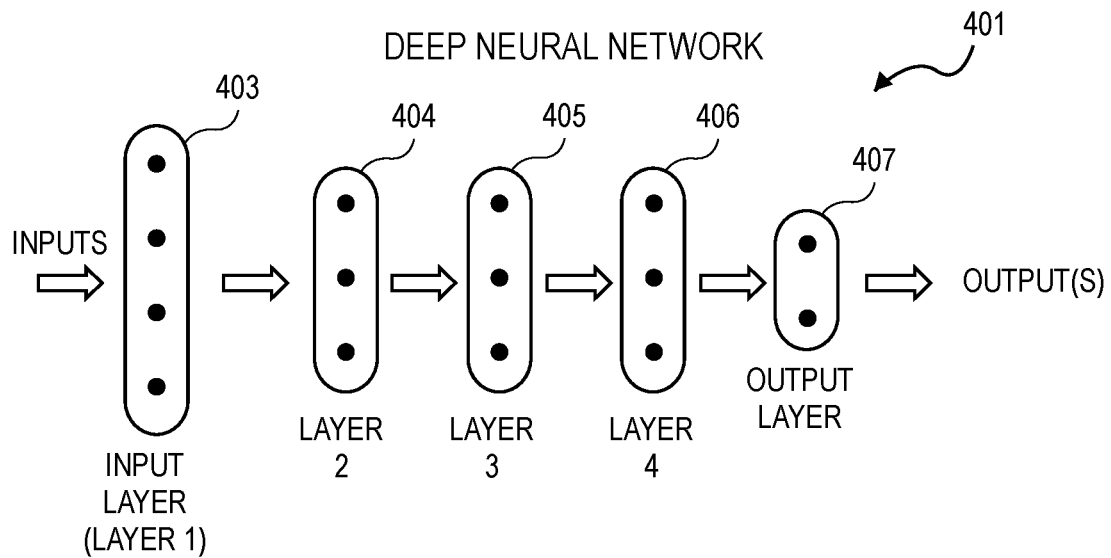
FIG. 7A
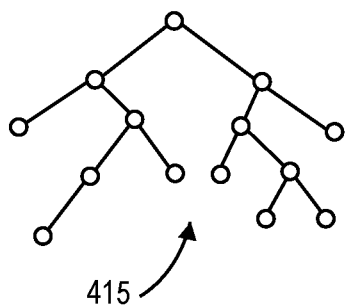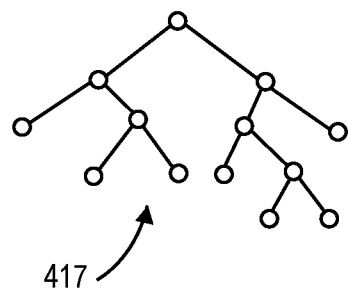
FIG. 7B

SYSTEMS AND METHODS FOR MACHINE LEARNING BASED RISKY CIRCUIT PATTERN IDENTIFICATION

This application claims the benefit of the filing date of U.S. provisional patent application No. 62/783,980, filed Dec. 21, 2018 and entitled Systems and Methods for Machine Learning Based Risky Circuit Pattern, and this provisional patent application is hereby incorporated herein by reference.

BACKGROUND

The design and testing of modern integrated circuits (ICs) is a complicated and expensive process. Such ICs can have millions of devices such as transistors connected together in a circuit pattern or topology. Circuit designers understand that certain circuit patterns are more prone to reliability problems such as electrostatic discharge, electrical overstress, aging, etc., because of the structure of the connections between devices and the usage (e.g. voltage and current levels) of the devices and physical parameters of the devices. These reliability problems can be related to various physical phenomena such as over voltage (e.g. excessive voltage at a junction), high current through a junction or channel, incorrect bias on a device, etc. Circuit designers will usually attempt to avoid creating unreliable circuit patterns, and modern circuit design tools, such as computer aided design software tools, can help to avoid or detect unreliable circuit patterns. However, identifying such circuit patterns is a hard task for a circuit netlist containing one million or more devices. Some circuit design software tools can perform simulations on a circuit netlist to determine whether the circuit netlist includes a circuit pattern that appears to be unreliable.

These simulations are limited by long run times and by the inability to simulate large circuits and the inability to simulate all input vector scenarios. Thus, a circuit can be designed, tested and then fabricated in hardware (e.g. a silicon IC) only to discover that is unreliable due to one or more circuit patterns that prove to be unreliable.

SUMMARY OF THE DESCRIPTION

Machine assisted systems and methods for detecting unreliable circuit patterns are described. These systems and methods can use a machine learning classifier that has been trained to recognize such circuit patterns to detect the unreliable circuit patterns without requiring computationally expensive simulations of a circuit netlist which can be over 1 million devices, such as over 1 million field effect transistors (FETs). The classifier, once trained, can recognize unreliable circuit patterns quickly and can be updated over time as new unreliable circuit patterns are discovered from simulations or other sources.

A method according to one embodiment described herein can include the following operations: receiving a circuit netlist; comparing the circuit netlist to a plurality of circuit patterns in a database, each of the plurality of circuit patterns in the database including at least one device that is unreliable; and determining, by a trained classifier, whether the circuit netlist includes a portion of the circuit that contains at least one device that is unreliable. In one embodiment, the comparison can include the operation of: matching, based upon connections between devices, the plurality of circuit patterns in the database to portions of the circuit netlist and providing one or more matched portions, from the matching, to the trained classifier and also providing device and operating parameters for the one or more matched portions to the trained classifier. In one embodiment, the trained classifier is trained using the plurality of circuit patterns in the database to recognize circuit patterns in a netlist that include at least one unreliable device. In one embodiment, the method can further include generating a matching score for the portion with a corresponding circuit pattern in the database.

In one embodiment, the trained classifier can be one of: (1) a trained neural network; or (2) a trained random forest of decision trees; or (3) a trained classifier based on a gradient-based boosting method.

In one embodiment, the matching can be performed in a manner in which the matching includes similarity matching and exact topology matching, based upon connections between the devices in the input circuit netlist, between the plurality of circuit patterns in the database and portions of the input circuit netlist.

In one embodiment, at least a subset of the plurality of circuit patterns in the database were added to the database as a result of outputs from simulations of other circuit netlists that indicated at least one circuit in the subset was unreliable. In one embodiment, the one or more matched portions are identified without performing simulations, of the input circuit netlist, that seek to identify unreliable circuits in the circuit netlist. In one embodiment, at least one device in each circuit pattern in the database is unreliable because of one or more of the following: (1) a device is prone to failure due to electrostatic discharge; (2) a device is prone to failure due to electrical overstress; (3) a device is prone to failure due to aging or electromigration; (4) incorrect bias on one or more devices; (5) excessive overvoltage across a junction; or (6) excessive current through a junction or channel.

In one embodiment, the plurality of circuit patterns can include one or more variations, for at least a first circuit pattern in the plurality of circuit patterns in the database. For example, a variation of a first circuit parameter that is topologically different than the first circuit pattern (such as a different circuit pattern) but is also unreliable can be included as a variation of the circuit pattern in the database.

Another embodiment relates to the creation of a classifier which can be used to detect unreliable circuit patterns in a circuit design. A method according to this another embodiment can include the following operations: receiving outputs from one or more circuit simulations, of one or more entire circuits, the circuit simulations indicating one or more unreliable devices in each of the one or more entire circuits; extracting, from each of the one or more entire circuits, at least one circuit pattern that is a subset of the entire circuit and contains one or more unreliable devices to provide one or more extracted circuit patterns; and training a classifier to recognize an unreliable circuit pattern in an input circuit netlist, the classifier trained by using each of the one or more extracted circuit patterns as inputs to and expected outputs of the classifier during the training. In one embodiment, the extracting can include an operation in which one or more circuit parameters are also extracted, wherein the circuit parameters include one or more of structural data or operational data of each of the one or more extracted circuit patterns. For example, the structural data can include data about the sizes of the devices and the operational data can include data about the manner of operating the devices including for example voltage and frequency parameters, etc. In one embodiment, the one or more extracted circuit patterns can be stored in a circuit template database that is used as a training data source to train the classifier. In one embodiment, the extracting can initially extract an unreliable device and one or more neighboring devices connected to the unreliable device for an initial selection of an extraction, and the extracting can then extend the initial selection to one or more additional neighboring devices to extract enough to allow recognition of a circuit pattern that is unreliable and resembles the extracted circuit pattern. In one embodiment, the extension of the initial selection is minimal to avoid including excess devices that are not needed to distinguish between an unreliable circuit and a similar but reliable circuit.

In one embodiment, the method of the alternative embodiment can further include the operation of generating one or more variations of each of the one or more extracted circuit patterns. Further, the method can further include pruning at least one of the generated variations. In one embodiment, the receiving of outputs of simulations can occur either serially over time such that simulations for a first circuit netlist are received and processed to train the classifier and then simulations for a second circuit netlist are received and processed to trained classifier or can alternatively be performed concurrently from multiple sources of the simulations.

The aspects and embodiments described herein can include non-transitory machine readable media that store executable computer program instructions that when executed can cause one or more data processing systems to perform the methods described herein when the computer program instructions are executed by the one or more data processing systems. The instructions can be stored in non-volatile memory such as flash memory or dynamic random access memory which is volatile or other forms of memory.

The above summary does not include an exhaustive list of all embodiments in this disclosure. All systems and methods can be practiced from all suitable combinations of the various aspects and embodiments summarized above, and also those disclosed in the Detailed Description below.

BRIEF DESCRIPTION OF THE DRAWINGS

The present invention is illustrated by way of example and not limitation in the figures of the accompanying drawings in which like references indicate similar elements.

FIG. 1C shows an example of how the databases containing extracted circuit patterns can be used and optionally shared.

FIG. 2A shows an example of a circuit pattern.

FIG. 2B shows another example of a circuit pattern.

FIG. 3 shows an example of a circuit template according to one embodiment.

FIG. 7A shows an example of a deep neural network which can be used in one embodiment for a trained classifier.

FIG. 7B shows an example of a random forest of decision trees which can be used in another embodiment for a trained classifier.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1A:
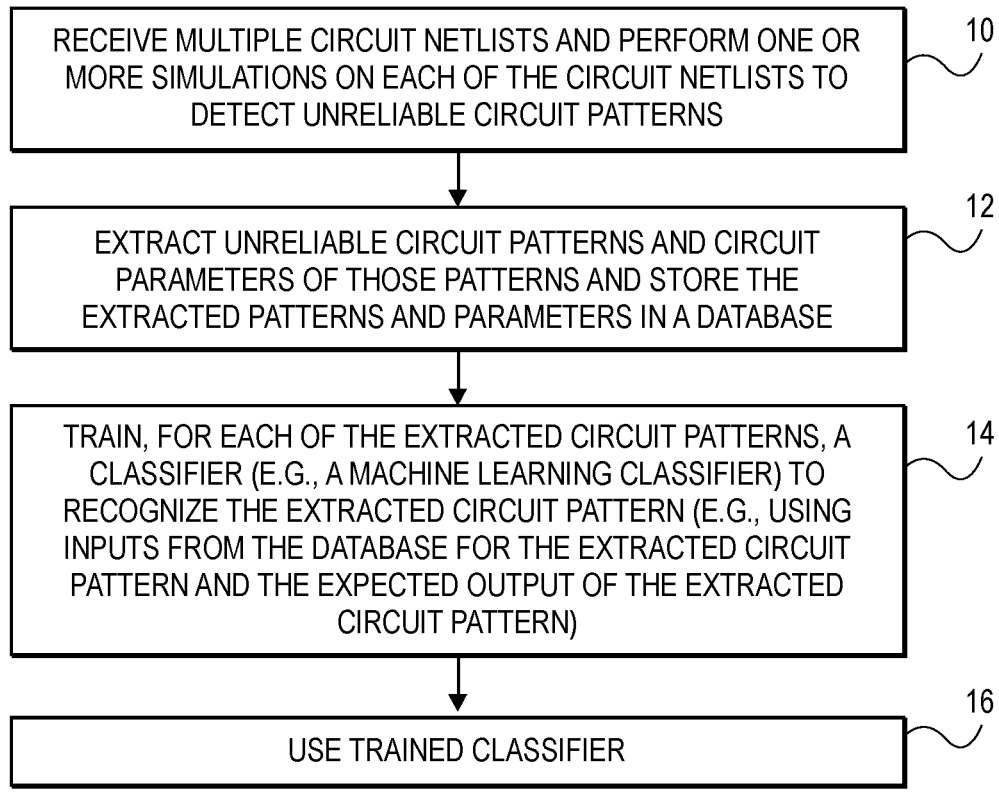
FIG. 1A is a flowchart which illustrates an overview method according to one embodiment which includes both training and use of a classifier.

The embodiments described herein can use a machine learning based classifier which is trained with previously identified unreliable circuit patterns which enable the trained classifier to accurately identify similar patterns in a given input circuit netlist or layout netlist without running long circuit simulations. Hence this approach can be a much faster approach by using the trained classifier and by avoiding long circuit simulations. Further, the embodiments can capture risk prone circuit patterns from circuit designers which can give a big advantage over traditional solutions which are dependent solely on circuit simulations. FIG. 1A shows an example which includes both training and use of a trained classifier. FIG. 1A represents an overview of a method according to one embodiment. In operation 10, a data processing system, such as the data processing system shown in FIG. 8, can receive multiple circuit netlists and perform one or more simulations of each of the circuit netlists to detect unreliable circuit patterns. Each of the simulations is performed separately on each of the circuit netlists in order to detect whether or not each of the circuit netlists include at least one unreliable circuit pattern. If a circuit netlist includes an unreliable circuit pattern, then operation 12 can be performed on each circuit netlist which produced a simulation result indicating that the circuit netlist included an unreliable circuit pattern. In operation 12, the system can extract each unreliable circuit pattern which is found in the circuit netlist and can also extract circuit parameters of those unreliable circuit patterns and store the extracted patterns and parameters in a database, such as a template database. One embodiment of the extraction of unreliable circuit patterns is described further below in conjunction with FIGS. 5A, 5B, and 5C. Then in operation 14, a classifier is trained for each of the extracted circuit patterns. The classifier in one embodiment can be a machine learning classifier such as a neural network classifier or other machine learning classifiers that are known in the art. The classifier can be trained to recognize the extracted circuit pattern. This can be performed by using inputs from the template database for the extracted circuit pattern and also using the expected output that identifies that extracted circuit pattern to cause the classifier to be trained for each of the extracted circuit patterns. After the classifier has been trained by operation 14, it can be used in operation 16. Further details regarding the training of a classifier will be provided below including the description associated with FIG. 5E below. The use of a trained classifier in operation 16 will be described further below in conjunction with a description of FIGS. 1B and 6A.

Figure 1B:
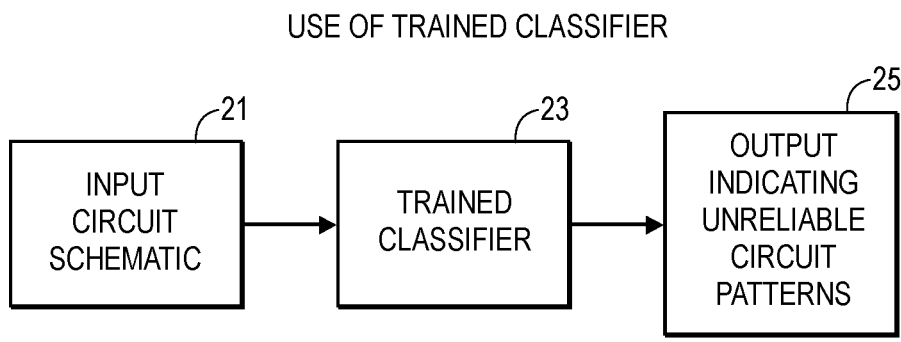
FIG. 1B shows the use of a trained classifier in a block diagram view according to one embodiment.

An example of the use of a trained classifier is shown in FIG. 1B. The trained classifier can be implemented on a data processing system which includes the trained classifier 23 and can include other components described below. The trained classifier can in one embodiment be implemented in software that accesses a data structure containing trained constants or other values that were generated from the training of the classifier, and the software can execute on a data processing system. The trained classifier 23 can receive an input of a circuit such as a circuit schematic or circuit netlist or other description of a circuit which can include millions of devices such as field-effect transistors. The input can be the input 21 provided to the trained classifier 23 which processes the input using one or more of the embodiments described herein to provide an output 25 that indicates whether or not the circuit schematic which was inputted contains any unreliable circuit patterns. The output 25 can be a list of unreliable circuit patterns that match circuit templates in a template database of unreliable circuit patterns that have been extracted from circuits that have undergone simulations which resulted in the identification of unreliable devices in these simulated circuits.

The method shown in FIG. 1A may be performed in simulation software which includes one or more embodiments described herein. Moreover, the method may be of performed by a single entity or by multiple entities that can work independently or can share the template database. In one embodiment, a software developer can create and provide the simulation software which includes the one or more embodiments described herein. FIG. 1C shows an example of a software developer 31 which can produce simulation software which can include the one or more embodiments described herein to detect unreliable circuit patterns. The software developer 31 can collect a set of circuit netlists, such as netlists 33 and can provide those netlists as an input to the simulation software to perform simulations 35 from which unreliable circuit patterns can be detected and extracted to produce an extracted circuit pattern database 37 which can be a template database. A licensee of the software developer's software, such as licensee 41 shown in FIG. 1C can independently provide netlists 43 as input to the simulation software from the software developer 31 to run simulations 45 to detect unreliable circuit patterns. These unreliable circuit patterns can be in one embodiment stored in the licensee's extracted circuit patterns which can be a circuit template database. In one embodiment, the licensee's extracted circuit patterns can be independent of the extracted circuit patterns 37 while in another embodiment, the licensee's extracted circuit patterns can be additional patterns added to base patterns from the software developer 31 to create an enhanced or extended extracted circuit patterns database 47 containing unreliable circuit patterns identified by the extracted circuit patterns 37 as well as unreliable circuit patterns identified by simulations 45 performed by the licensee 41. In one embodiment, the licensee 41 may share the licensee's extracted circuit patterns with the developer 31 as indicated by the dashed line from database 47 to database 37. In this way, the database 37 can be enhanced by and added to by licensees of the software developer 31 in one embodiment.

Before describing further details of the one or more embodiments, some definitions will be provided while referring to FIGS. 2A, 2B, and 3. FIG. 2A shows an example of a single device 51 as an example of a circuit pattern. The device 51 is a field effect transistor (FET) which includes a gate, a source, and a drain as is known in the art. FIG. 2B shows another example of a circuit pattern 55 that includes a driver 57, a receiver 59, and three devices 61, 63, and 65. The circuit pattern 55 is a more complex circuit pattern or circuit schematic and it shows the connections between each of the devices 61, 63, and 65 as well as the connections between those devices and the driver 57 and the receiver 59. As is known in the art, the circuit pattern 55 can be represented in a plurality of different ways using techniques known in the art such as a graph model representation shown in FIG. 6C below. The graph model representation may be obtained from a circuit schematic or circuit pattern using techniques known in the art, and such representation may be useful for various implementations of the embodiments described herein. In one embodiment, a circuit netlist can be represented as a graph consisting of a set of vertices, V, and edges, E, such that each vertex represents an electrical node in the netlist and each edge represents a connection between two nodes. FIG. 3 shows an example of a circuit template 71. In one embodiment, a circuit template can include the circuit pattern showing the devices and the connections between those devices and can also include device parameters and operational parameters for the circuit pattern and also include the drivers which provide inputs to the circuit pattern as well as receivers which receive outputs from the circuit pattern. In the example shown in FIG. 3, the circuit template includes device information for each of the devices 73, 75, 77, and 79 and the receiver which has a gate coupled between devices 73 and 79 as shown in FIG. 3. Each of these devices includes device parameters which specify the width and the length of the channels of each of the devices which are field-effect transistors. The device parameters can also include the number and type of devices, the capacitance of the devices, the fingers of the devices, fanout information, power domain information, etc. In addition, other circuit parameters can include information about how the devices are operated which can include information about voltage, frequency, current, etc. in one embodiment. In one embodiment, the circuit template information provides the circuit pattern and sufficient information about the structure and operation of the circuit to allow for proper matching by a classifier that is been trained, where the classifier matches an extracted circuit pattern from an input netlist to one or more extracted circuit patterns in a template database as described further below.

Figure 4:
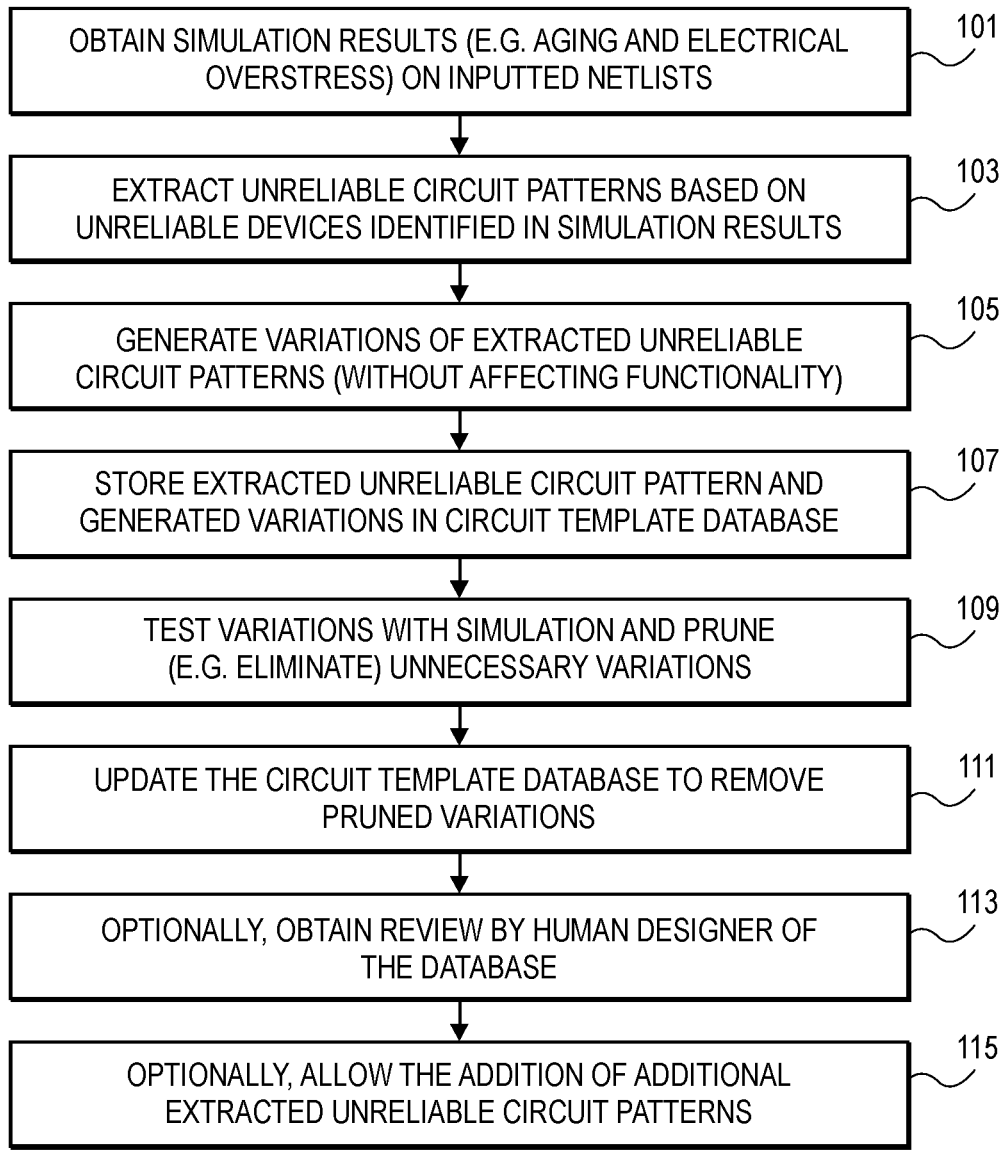
FIG. 4 is a flowchart which illustrates a method that can be employed to create training data for use in training a classifier according to one embodiment.
Figure 5A:
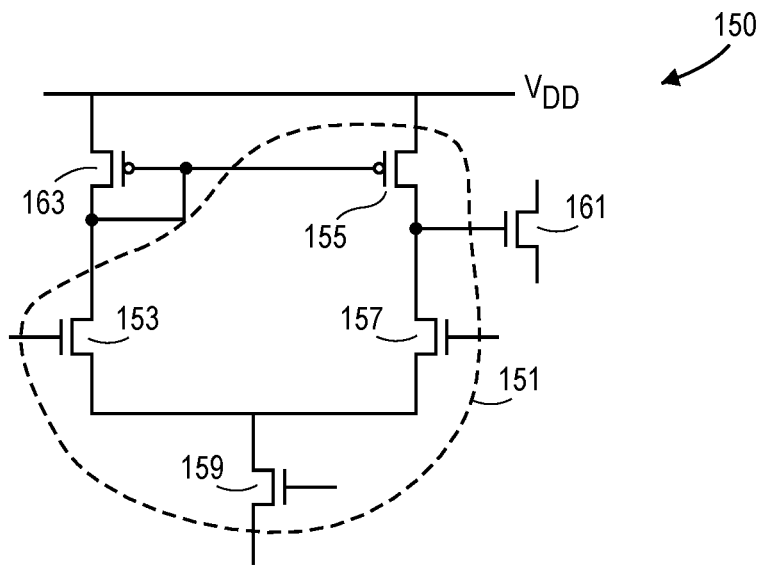
FIG. 5A shows an example of a circuit pattern which is extracted according to one embodiment.
Figure 5B:
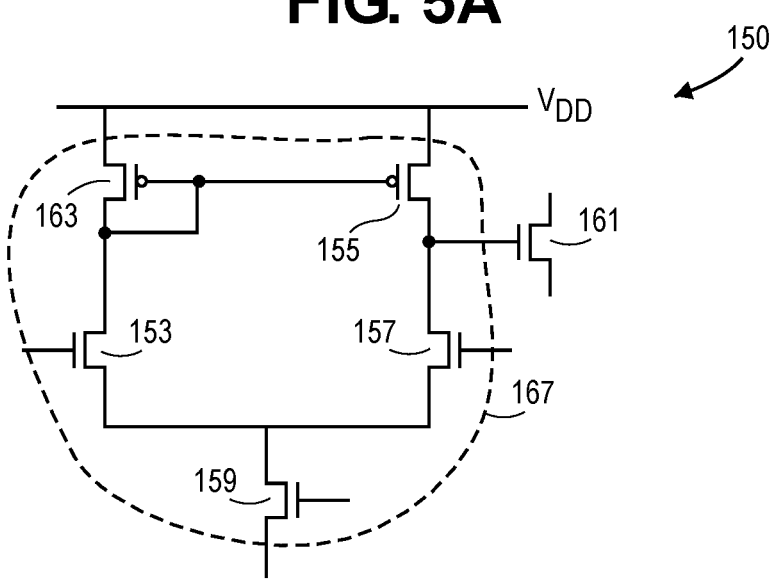
FIG. 5B shows an example of an embodiment in which an extracted circuit pattern is extended to create an extended extracted circuit pattern.
Figure 5C:
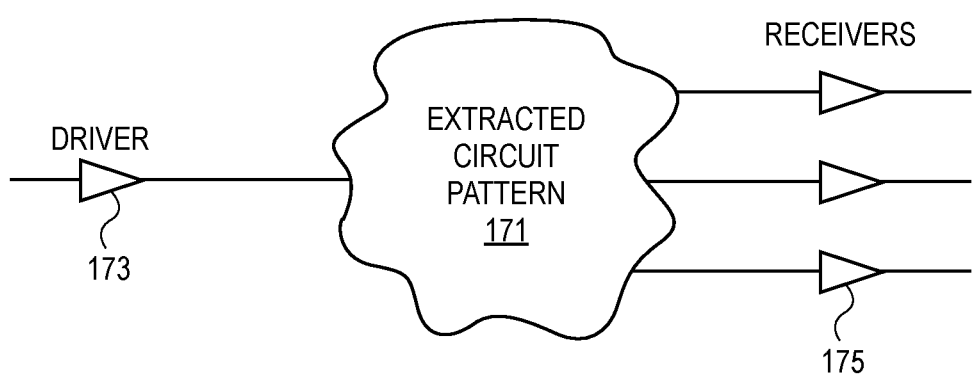
FIG. 5C shows how the extracted circuit pattern, such as the extracted circuit pattern of FIG. 5B, is extended to include drivers and receivers according to one embodiment.

FIG. 4 shows an example of how training data can be created, and this training data can be used to train a classifier in one or more embodiments described herein. In operation 101, simulation results are obtained from a plurality of netlists. In one embodiment, many netlists can be inputted to simulation software which simulates the operation of the circuit described in the netlist over a period of time to determine whether there are unreliable devices in each circuit. The simulation can test for aging effects, electrical overstress effects, electrostatic discharge effects, incorrect bias effects, overvoltage at junctions, electromigration failures, or excessive current through a junction or channel and other tests that software circuit simulators can perform as is known in the art. Each simulation can produce an output indicating devices which are susceptible to such effects or problems and thus are unreliable. The simulation results can specify the particular unreliable device in the particular netlist which can be used in subsequent operations to extract an unreliable circuit pattern from the inputted netlist. Operation 103 includes the extraction of unreliable circuit patterns based on the unreliable devices identified in the simulation results. FIGS. 5A, 5B, and 5C, described below, provide examples of an extraction process which can be used in operation 103. Then in operation 105, one or more variations of the extracted unreliable circuit patterns can be generated. These variations are generated in a way which does not affect the functionality of the circuit in terms of its operations on the input signals and the resulting output signals which are provided from the extracted circuit pattern. Further information about the variations and the process of generating the variations is described below and also shown in FIG. 5D. Then in operation 107, the extracted unreliable circuit patterns and the generated variations can be stored in one embodiment in a circuit template database, such as the circuit template database shown in FIG. 6D which is described further below. In one embodiment, the variations can be tested in operation 109 with the simulation software to determine whether or not they are unreliable. In one embodiment, the testing in operation 109 can determine that some other variations are not unreliable and thus they can be eliminated as unnecessary variations in a pruning operation which can be part of operation 109. The circuit template database can then be updated in operation 111 to remove any pruned variations which were tested in operation 109 and determined to be reliable circuit patterns. Operation 113 can be performed as an optional operation and can involve a review by a human designer of the template database. Once the template database has been reviewed in one embodiment, it can be stored and then used in a training operation to train the classifier and can also be used when the trained classifier is used as described further below. Optionally, the template database may be updated over time with the addition of additional extracted unreliable circuit patterns as new unreliable circuit patterns are discovered in new circuit netlists from simulation results of the new circuit netlists. This is shown as operation 115 which can be optional in one embodiment. If such additional extracted unreliable circuit patterns are added to the training data, the trained classifier should be trained again with the addition of the additional extracted unreliable circuit patterns to add to the machine learning data embodied in the trained classifier to take into account the additional extracted unreliable circuit pattern. Operation 115 can be repeated each time a new additional extracted unreliable circuit pattern is discovered and added into a template database which can then be used to train the trained classifier again.

FIGS. 5A, 5B, and 5C show an example of how a circuit pattern can be extracted from a larger circuit. The circuit pattern 150 is a portion of an entire circuit; for example, the entire circuit may include over a million devices, and thus circuit pattern 150 in this case is a very small portion of the entire circuit. The circuit pattern 150 includes six devices 161, 163, 153, 155, 157, and 159. An extraction process typically begins by finding the one or more unreliable devices specified in the simulations results and then by finding one or more neighbors or neighboring devices that are directly connected to the one or more unreliable devices. In the example shown in FIG. 5A, the device may have been indicated to be unreliable in the simulation results and the extraction process begins by an initial selection of devices to create an initial extracted circuit pattern 151 which includes devices 153, 155, 157, and 159. The devices 155, 153 and 159 were included as neighboring devices that are directly channel connected to the device 157 which is indicated to be unreliable by an output from a simulation of the entire circuit of which circuit pattern 150 is part. In one embodiment, the extraction process continues by extending the initial selection of the extracted circuit pattern to create the extended extracted circuit pattern 167 shown in FIG. 5B. The extended extracted circuit pattern 167 adds the device 163 to the initial extracted circuit pattern 151 to create the extended extracted circuit pattern 167. Again, the circuit pattern 150 is a portion of an entire circuit which was simulated to provide simulation results which indicated that the device 157 is unreliable. In one embodiment, an algorithm can be used to find a minimal circuit pattern from an identified unreliable device from the simulation results. The minimal circuit pattern that can be discovered by the algorithm can then be added into the template database as described herein. In one embodiment, for each unreliable device in a given netlist with simulation results, the algorithm could start with the unreliable device and its immediate neighbors which are directly channel connected to the unreliable device and finds whether this pattern matches any reliable pattern in any netlist. If such reliable pattern is found, then the algorithm expands the minimal circuit pattern from the initial selected circuit pattern until the minimal circuit pattern matches only circuit patterns which have at least one unreliable device. Then, the found minimal circuit pattern can then be added to the templates database. In one embodiment, an algorithm for capturing the minimal circuit pattern can attempt to avoid including excess devices that are not needed to distinguish between an unreliable circuit and a similar but reliable circuit. Other techniques to determine the unreliable circuit pattern based on the proximity to the unreliable device can be used. In one embodiment, the algorithm can be implemented using the following pseudocode.

```
PrunedCCRList = empty
For each netlist i
    For each "at risk" device in current netlist
        TempCCR = "at risk device" + immediate neighbors
            Short R, open C
            If number of devices in both TempCCR & FullCCR > 3
                Add TempCCR to PrunedCCRList
                For each netlist j,j != i
                    while (TempCCR matches a non-risk device
                    CCR == true)
                        Expand TempCCR to include another device,
                        short R, open C
                    Find TempCCR in PrunedCCRList == false
                        Add TempCCR to PrunedCCRList
                    Add the drivers and receivers of the "at risk"
                    device
Add PrunedCCRList to Templates Database
```

Figure 5D:
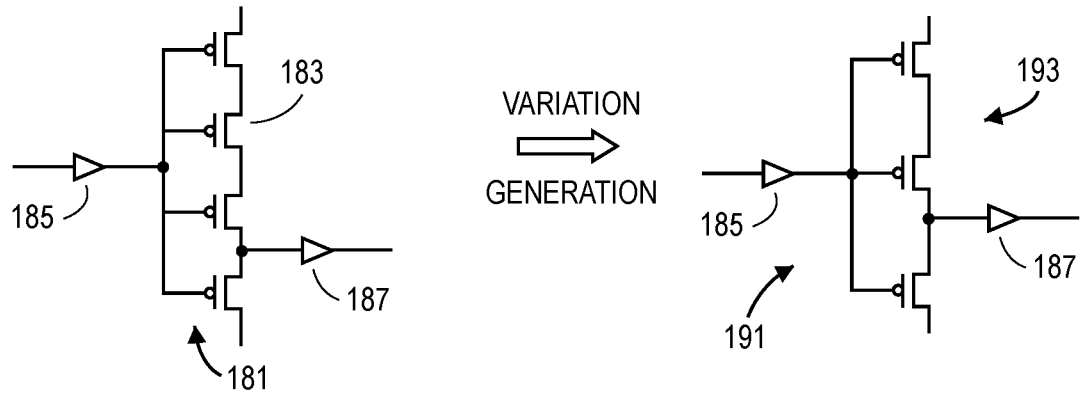
FIG. 5D shows an example of how variations can be created for an extracted circuit pattern according to one embodiment.

After a circuit pattern has been extracted through the use, in one embodiment, of a minimal capture algorithm, which can include an extension of an initially selected extracted circuit pattern, then the drivers which provide inputs to the extracted circuit pattern and the receivers which receive outputs from the extracted circuit pattern can be added to the extracted circuit pattern to provide the final extracted circuit pattern. This is shown in FIG. 5C in which the final extracted circuit pattern 171 also includes driver 173 and receivers 175 as shown in FIG. 5C. In one embodiment, the process of creating extracted circuit patterns can continue by generating variations of the extracted circuit pattern, and this is shown in FIG. 5D. These variations can be based upon changes to the circuit pattern or changes to the device parameters, and each of these variations can be tested in operation 109 to determine whether they remain unreliable; if the variation turns out to be reliable, then the variation can be pruned in operation 111 described above. In the example shown in FIG. 5D the circuit pattern 181 includes a driver 185 and a receiver 187. The circuit pattern 181 also includes four P-channel field effect transistor devices 183 which are coupled in series as shown in FIG. 5D. In one embodiment, a variation can be generated in which the four P-channel devices 183 are replaced with three P-channel devices 193 which are coupled in series and which receive an input from a driver 185 and provide an output to a receiver 187. The variation which includes the three P-channel devices 193 can then be tested in operation 109 to determine whether or not it should remain in the template database.

Figure 5E:
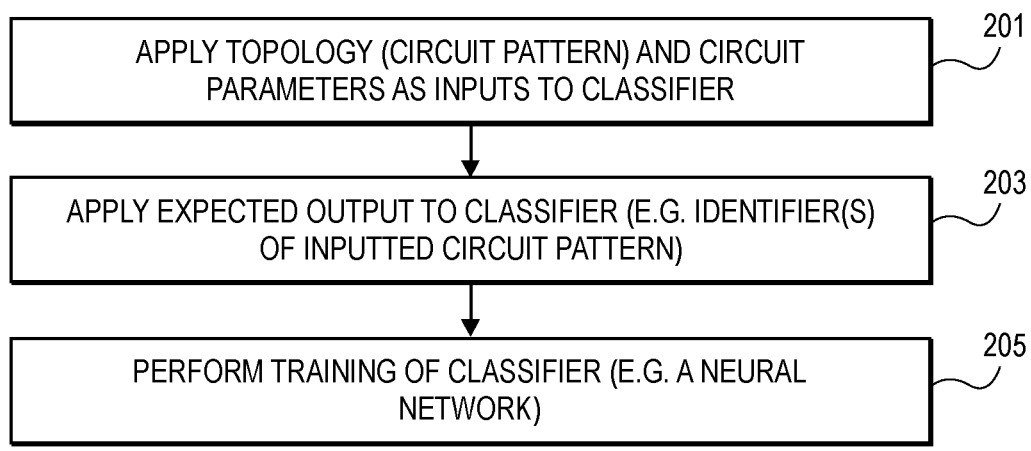
FIG. 5E is a flowchart which illustrates one embodiment for training a classifier.
Figure 6A:
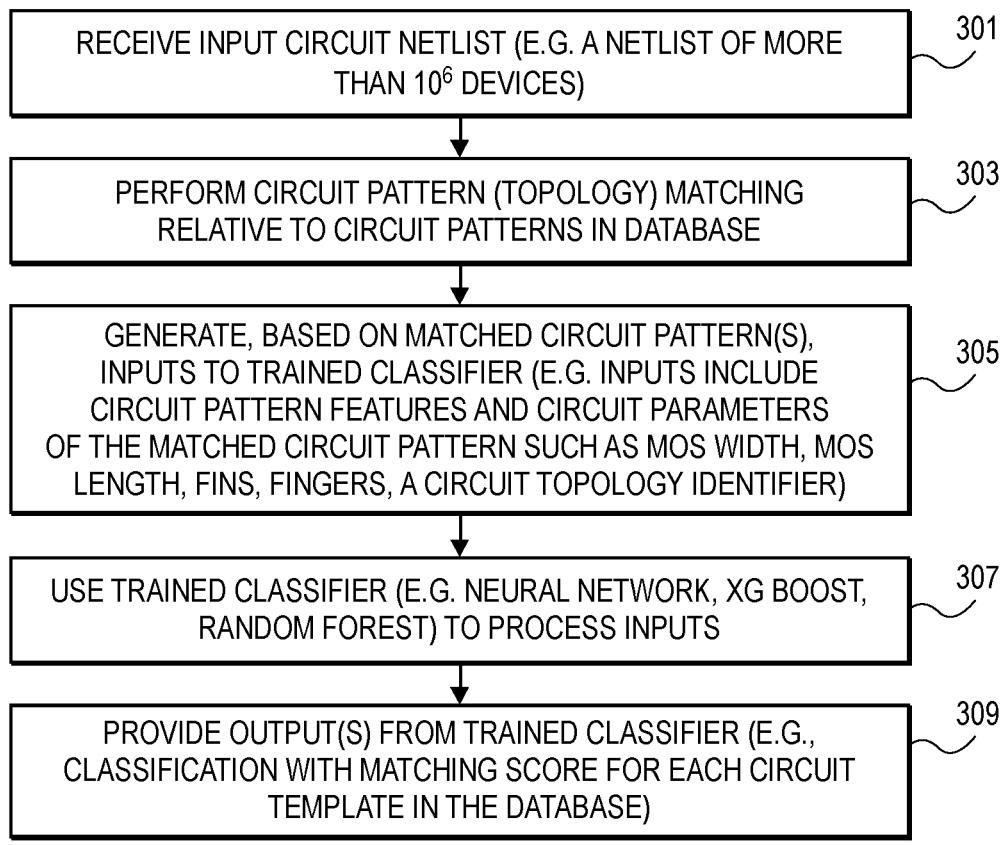
FIG. 6A is a flowchart which illustrates a method for using a trained classifier according to one embodiment.
Figure 6B:
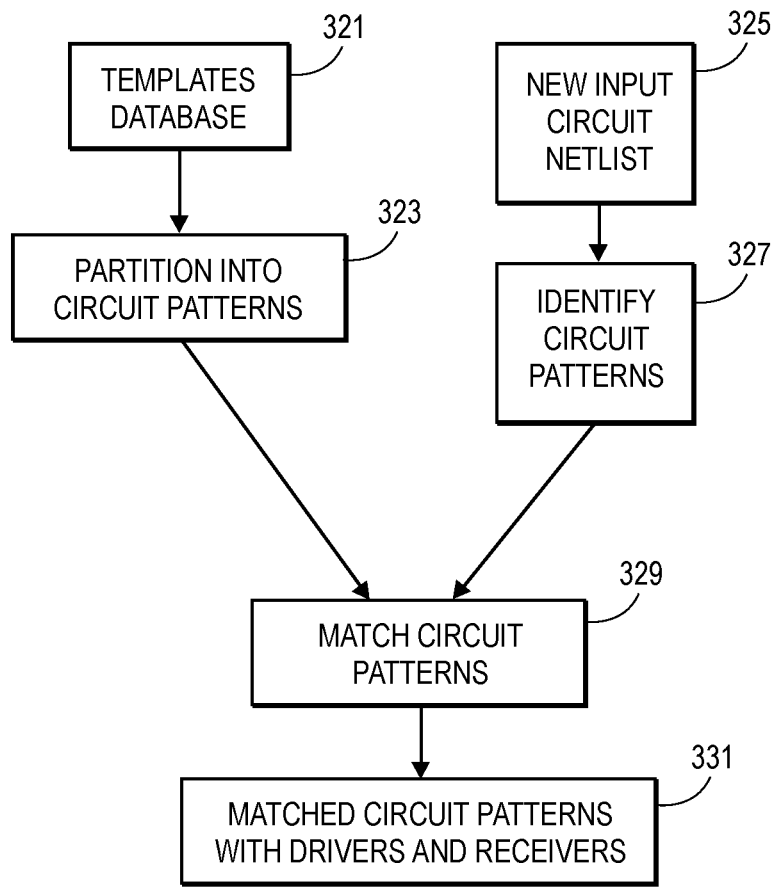
FIG. 6B shows an example of a system and process for using a trained classifier according to one embodiment.
Figure 6C:
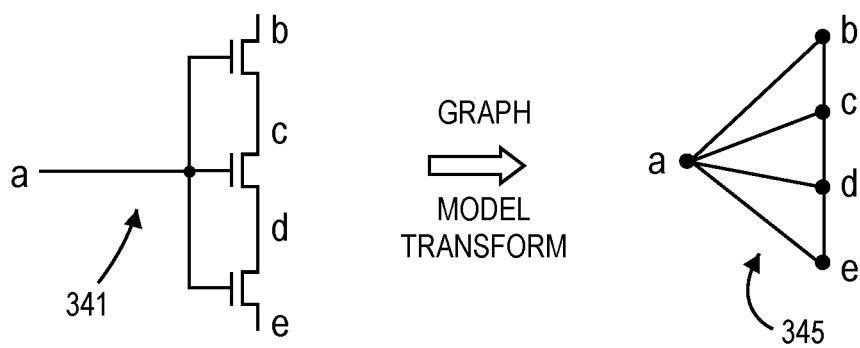
FIG. 6C shows an example of how a circuit pattern or circuit schematic can be transformed into a graph model as is known in the art, which transformation can be used in the one or more embodiments described herein.

Once the template database has been generated, it can be used to train a classifier and this is shown in the method of FIG. 5E. The template database can also be used when the trained classifier is attempting to classify an input netlist in the process of using the trained classifier (such as the use of the trained classifier shown in FIG. 1B). In operation 201 of FIG. 5E, each extracted circuit pattern and circuit parameters from a template database can be applied as inputs to a classifier. At the same time, the expected outputs of the classifier are also applied to the classifier in operation 203 shown in FIG. 5B using techniques known in the art. These outputs can indicate or include an identifier of the inputted circuit pattern which is known to be unreliable or can include other data or information which uniquely identifies the inputted circuit pattern. Using techniques known in the art, the classifier is then trained in operation 205 to produce a trained classifier which in one embodiment can be a neural network, such as the neural network shown in FIG. 7A which is described further below, or can be a random forest of decision trees shown in FIG. 7B which is described further below. In another embodiment, the classifier can be a classifier that is trained using a gradient-based boosting method such as XGBoost. In one embodiment, the training of the classifier can use the following features and labels: These features are not exclusive.
    Features
        Matching topology: This provides information about
            the connectivity of the devices in the matched pattern
            and the corresponding matched template
        Number of NMOS devices in the matched pattern
        Number of PMOS devices in the matched pattern
        Resistor and capacitor values in the pattern
        Width of the MOS devices
        Channel length of the MOS devices
        Number of fingers and fins of the MOS devices
        Power domains of the MOS devices in this pattern
        Number of drivers and receivers
        Sizes of the drivers and receivers
        Any other electrical/physical parameter of the devices
            which may be important for a particular reliability
            issue
    Labels for training data
        Circuit template number which matches exactly or
            similarly this circuit pattern for a reliability problem, FIG. 6A shows an example of a method of using a trained classifier to discover potential unreliable circuits in an input circuit which is described in an input circuit netlist. The method shown in FIG. 6A can be performed by a data processing system which can be similar to the system shown in FIG. 1B or shown in FIG. 8. Moreover, components of the system can be similar to the components shown in FIGS. 6B and 6D. The system can include a database of templates, such as the database 351 shown in FIG. 6D or the database of templates 375 shown in FIG. 6E. Referring to FIG. 6A, in operation 301 the method receives an input circuit netlist which is to be tested using the trained classifier. In one embodiment the netlist may be an entire circuit which includes more than a million devices such as more than a million field-effect transistors. The testing of the entire circuit can be performed using the trained classifier without having to perform computationally expensive simulations of the entire circuit. The use of the trained classifier may provide a quick answer (in less than an hour) of whether or not the entire circuit contains any unreliable devices and the circuit pattern which may potentially cause this unreliability issue; on the other hand, a full-blown simulation of the entire circuit may take many hours to be completed. FIG. 6B shows an example of a new input circuit netlist 325 which is provided to a system to test the input circuit using the trained classifier according to one or more embodiments described herein. Referring back to FIG. 6A, in operation 303, a pattern matching or topology matching operation is performed to determine whether or not any circuit patterns in the template database match either exactly or similarly with patterns in the input circuit netlist. This matching is shown as match circuit patterns 329 in FIG. 6B. The matching of the patterns can follow a partitioning operation 323 which partitions circuit patterns from the templates database 321 shown in FIG. 6B. In this embodiment, the circuit patterns for each extracted circuit pattern in the templates database are attempted to be matched with circuit patterns in the input circuit netlist. In one embodiment, the pattern or topology matching is performed prior to providing any inputs to the trained classifier. The advantage of this approach is that the classifier is called into action only when needed when a match is found. Referring back to FIG. 6A, this can be seen in operation 305 which follows operation 303. In operation 305, when a circuit pattern in the input circuit netlist is matched with a circuit pattern in the template database, then the inputs to the trained classifier are generated based upon the match. For example, the inputs can include the circuit patterns and circuit parameters of the matched pattern from the input circuit netlist which are applied as inputs to the trained classifier. These inputs can include circuit parameters that specify device details such as width and length of devices, fingers of devices, fins of devices and other information described herein. Then in operation 307, the trained classifier can be used to process the inputs. Finally, the trained classifier can provide in operation 309 one or more outputs that specify one or more classifications with optional matching scores for each circuit template in the database. This can be seen in FIGS. 6D and 6B which are described further below.

FIG. 6B shows a process and system which uses a templates database to be matched against circuit patterns in input circuit netlist 325. In particular, the templates database 321 can be generated from the training data that was created using the method shown in FIG. 4. The templates database can include, in one embodiment, variations of the extracted unreliable circuit patterns in addition to device parameters and operating parameters for each extracted unreliable circuit pattern. The templates database 321 can be partitioned into different circuit patterns 323 which can each be corresponding to the extracted unreliable circuit patterns obtained in the creation of the training data shown in FIG. 4. The input circuit netlist 325 can be processed to identify circuit patterns 327 which can then be matched against circuit patterns from the templates database 321 in a matching process 329. The result of the matching process 329 produces matched circuit patterns 331 with their drivers and receivers, and these matched circuit patterns 331 can be provided as inputs to a trained classifier. In one embodiment, the topology or pattern matching used by matching process 329 can use a graph model such as a graph model shown in FIG. 6C to match between two different circuit patterns. In the example shown in FIG. 6C, the circuit pattern 341 is converted into a graph 345 and the graph can be used in the pattern or apology matching process 329.

Figure 6D:
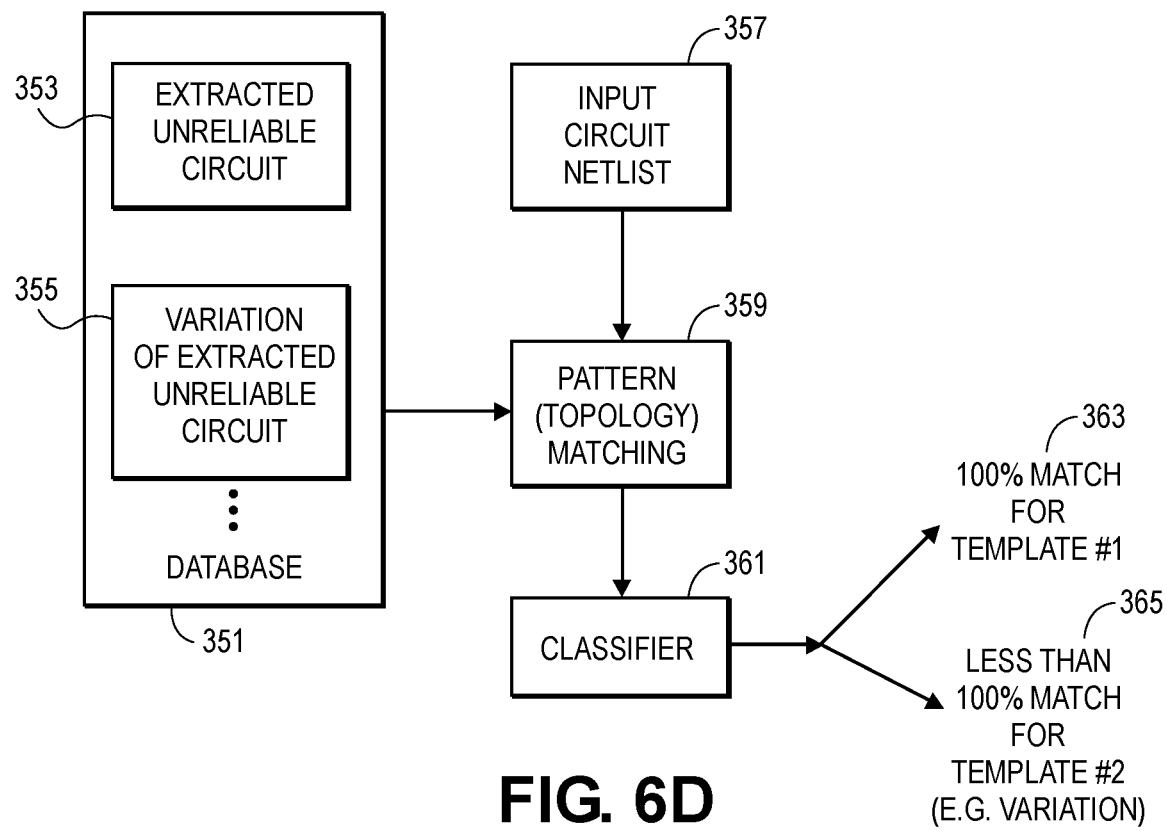
FIG. 6D shows another example according to one embodiment which uses a trained classifier to provide scores for the matching operation based upon both the extracted unreliable circuit and one or more variations of the extracted unreliable circuit.
Figure 6E:
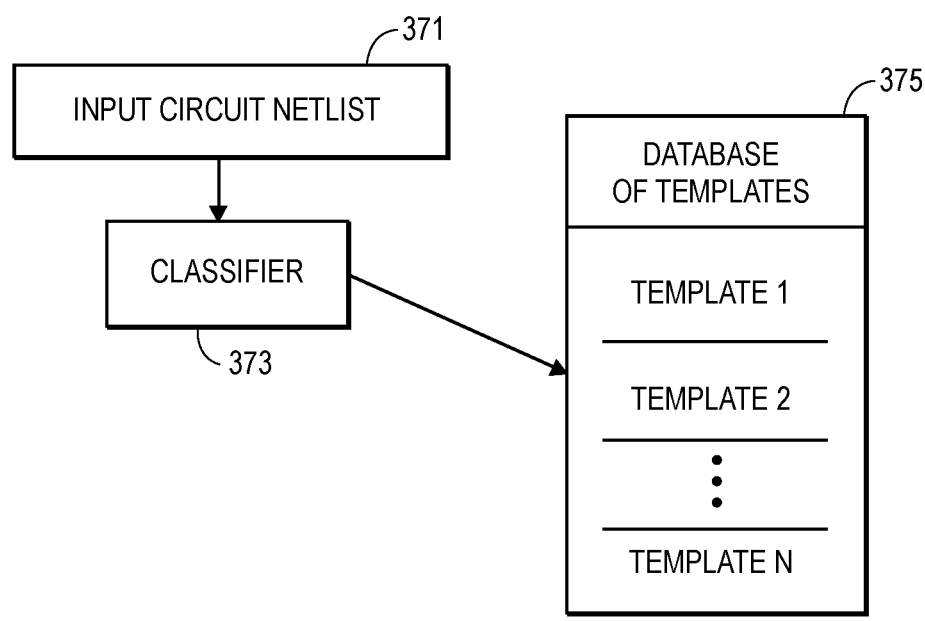
FIG. 6E shows an example of how a classifier, that has been trained, can classify an input circuit netlist to indicate matches found in a database of templates which specify unreliable circuits in the database.

FIG. 6D shows another example of a process and system for using the trained classifier to detect unreliable circuit patterns in an input circuit netlist, such as the input circuit netlist 357. The system which implements FIG. 6D can be the system shown in FIG. 8 which can include a templates database 351 which has a plurality of extracted unreliable circuits and the circuit parameters associated with those circuits as well as variations of the extracted unreliable circuit patterns and their circuit parameters, such as device and operational parameters of the variations. This database can be used during the process of using the trained classifier to detect unreliable circuits in the input circuit netlist 357. Before the trained classifier is used, a pattern matching operation is performed in operation 359, which can be similar to the pattern matching 329 shown in FIG. 6B. The result of any pattern matching can then be supplied as inputs to the trained classifier 361 which can provide outputs indicating matches to the various templates in the template database 351. In the example shown in FIG. 6D, the trained classifier 361 has identified two matching templates with scores for those templates. In particular, score 363 indicates a 100% match for template number one (so template number one exactly matches a circuit pattern found in the input circuit netlist 357) while score 365 indicates a score of less than 100% match for template number two which can be a variation of template number one. Score 365 indicates that template number 2 matches (but not an exact match) a circuit pattern found in the input circuit netlist 357. The match can be not exact as a result of a difference in the two circuit patterns or a difference in device or operating parameters, etc. In one embodiment, each extracted unreliable circuit can have its own template in the database of templates and this is shown in FIG. 6E. In particular, the templates database 375 includes N templates for extracted unreliable circuit patterns which can be matched by the trained classifier 373 in response to receiving an input circuit netlist 371 as described herein.

The trained classifiers can be implemented using known machine learning classifiers, such as deep neural networks or random forest of decision trees or trained classifiers utilizing XGBoost methods. FIG. 7A shows an example of a deep neural network 401 which includes layers 403, 404, 405, 406, and 407. These layers are trained using techniques known in the art in which inputs or features from the templates database are applied as inputs to the input layer which is layer 403 while also applying outputs which are expected outputs (for a given input) to the output layer which is output layer 407. After training the deep neural network 401, the neural network can recognize another circuit input having the same features as inputs applied to the layer 403 during train and produce an output which indicates the particular template in the template database which matches the input circuit that was applied to the trained neural network. Further information about deep neural networks can be found in the article "Deep Learning" by Yann LeCun, Yoshua Bengio, and Geoffrey Hinton in Nature Vol 521, 7553, page 436 (2015). FIG. 7B shows an example of another classifier which can be used as a machine learning classifier. In particular, FIG. 7B shows an example of a random forest of decision trees which can be trained using techniques known in the art and then used as described herein as a trained classifier to detect unreliable circuit patterns in an input circuit netlist. Further information about such random forests can be found in L. Breiman, "Random Forests", Machine Learning, 45.1, 5-32 (2001). Another type of classifier that can be used in one or more embodiments is a classifier that uses the gradient-based boosting method such as the XGBoost method. Further information about an XGBoost method can be found in T. Chen, C. Guestrin, "A Scalable Tree Boosting System", KDD 2016. Note that in a practical implementation several classifiers can be evaluated and the one with the best overall performance can be selected.

Figure 8:
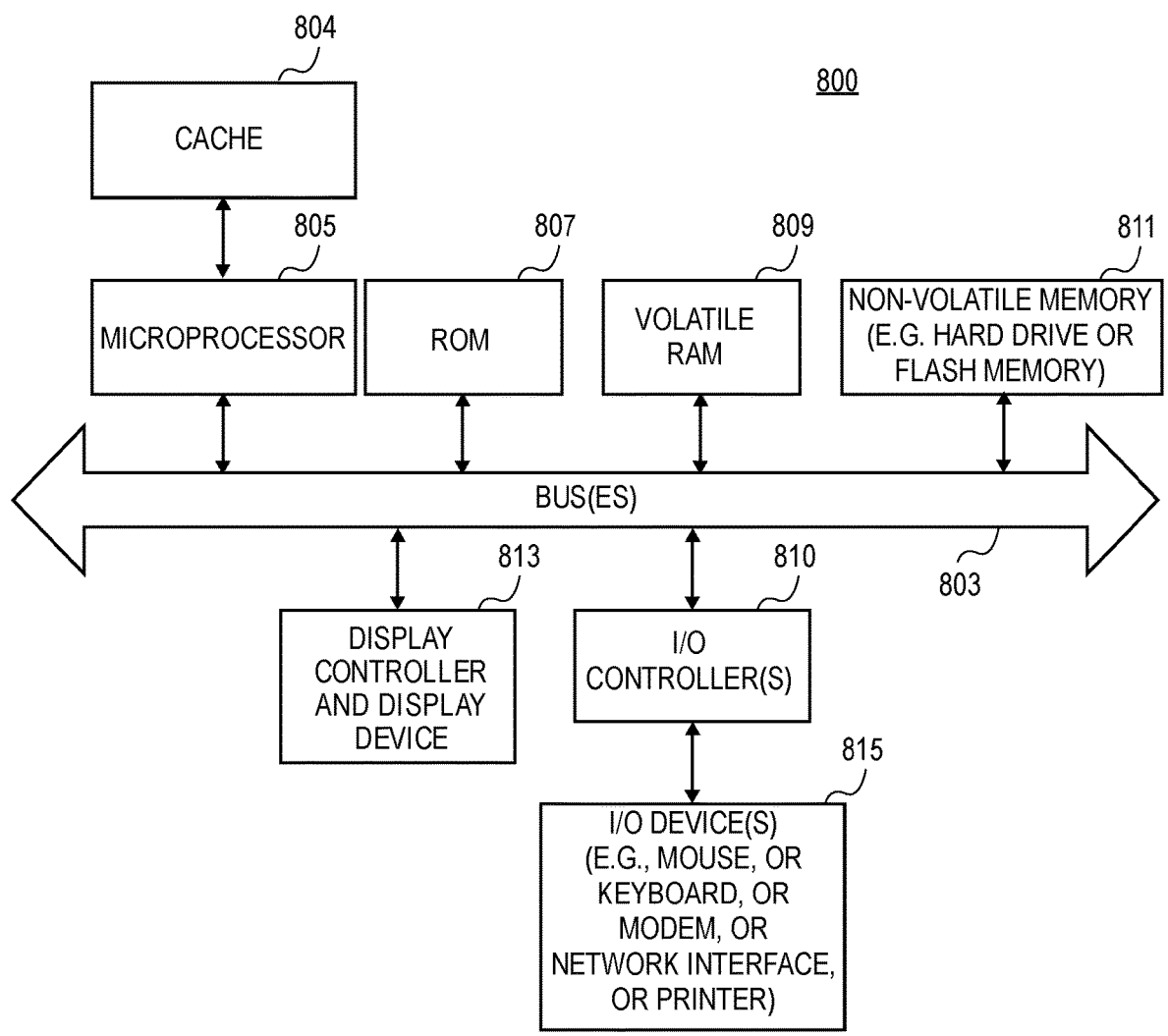
FIG. 8 is a block diagram of a data processing system which can be used to perform the one or more embodiments described herein. For example, the data processing system shown in FIG. 8 can be used to train a classifier, and the same data processing system can be used to classify input circuits using the trained classifier. As another example, the data processing system shown in FIG. 8 can be used after a classifier has been trained by another system to classify input circuits using the trained classifier.

FIG. 8 shows one example of a data processing system 800, which may be used with one embodiment. For example, the system 800 may be implemented to include a system as shown in FIG. 1B or may be implemented to provide a system that receives netlists and trains one or more classifiers. Note that while FIG. 8 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 8, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 8 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data processing system cause the data processing system to perform a method comprising:
   receiving a circuit netlist for a design of a circuit including a plurality of devices and connections between the plurality of devices;
   determining if a portion of the circuit netlist matches a circuit pattern in a database, the circuit pattern in the database including a device that is indicated unreliable and the device is channel connected to neighboring devices in the circuit pattern;
   generating inputs to a trained classifier, responsive to determining the portion of the circuit netlist matches the circuit pattern in the database, the trained classifier trained based on the circuit pattern, wherein the inputs include circuit parameters from the portion of the circuit netlist including one or more devices, wherein the circuit parameters include channel length of the one or more devices, width of the one or more devices, and numbers and sizes of drivers and receivers in the portion of the circuit netlist;
   processing, by the trained classifier, the inputs to determine a reliability about the design of the circuit by identifying at least one device that is unreliable without performing a simulation on the circuit netlist, based on the trained classifier receiving and processing the inputs generated for the trained classifier; and
   generating a data output by the trained classifier that comprises the reliability about the design of the circuit indicating that the circuit netlist contains at least one device that is unreliable and the identified at least one device that is unreliable for update of the design of the circuit to avoid the at least one device that is unreliable.

2. The medium, as in claim 1, wherein circuit patterns are stored in the database, each circuit pattern including at least one device that is unreliable, wherein the comparing comprises:
   matching, based upon connections between devices, the circuit patterns in the database to portions of the circuit netlist and providing one or more matched portions, from the matching, to the trained classifier and providing device and operating parameters for the one or more matched portions to the trained classifier.

3. The medium, as in claim 2, wherein the trained classifier is trained using the circuit patterns in the database to recognize circuit patterns in a netlist that include at least one unreliable device.

4. The medium, as in claim 3, wherein the portion of the circuit netlist is one of multiple matching portions and wherein the method further comprises:
   generating a matching score for the portion of the circuit netlist with a corresponding circuit pattern in the database.

5. The medium, as in claim 4, wherein the trained classifier is one of: (1) a trained neural network; or (2) a trained random forest of decision trees; or (3) a trained classifier based on a gradient based boosting method or any machine learning based classifier.

6. The medium, as in claim 2, wherein the matching performs similarity and exact topology matching, based upon connections between devices, between the circuit patterns and portions of the circuit netlist.

7. The medium, as in claim 4, wherein at least a subset of the circuit patterns in the database were added to the database as a result of outputs from simulations of other circuit netlists that indicated at least one circuit in the subset was unreliable.

8. The medium, as in claim 2, wherein one or more matched portions are identified without performing simulations, of the circuit netlist, that seek to identify unreliable circuits in the circuit netlist.

9. The medium, as in claim 1, wherein the device is indicated unreliable because of one or more of the following: (1) a device is prone to failure due to electrostatic discharge; (2) a device is prone to failure due to electrical overstress; (3) a device is prone to failure due to aging or electromigration; (4) incorrect bias on one or more devices; (5) excessive over voltage across a junction; or (6) excessive current through a junction or channel.

10. The medium, as in claim 1, wherein the circuit patterns include one or more variations, for at least a first circuit pattern in the circuit patterns, of the first circuit pattern that is topologically different than the first circuit pattern but is also unreliable.

11. A non-transitory machine readable medium storing executable program instructions which when executed by a data processing system cause the data processing system to perform a method, the method comprising:
   receiving outputs, from one or more circuit simulations, of one or more entire circuits, the circuit simulations indicating one or more unreliable devices in each of the one or more entire circuits;
   extracting, from each of the one or more entire circuits, at least one circuit pattern that is a subset of the entire circuit and contains one or more indicated unreliable devices and neighboring devices that are channel connected to the one or more indicated unreliable devices to provide one or more extracted circuit patterns;
   generating a training set of data comprising each of the one or more extracted circuit patterns and expected outputs indicative of a reliability of said each of the one or more extracted circuit patterns; and
   training a classifier to recognize a reliability about a design of a circuit in an input circuit netlist without simulation on the circuit netlist, based on the classifier receiving inputs including circuit parameters from the input circuit netlist including one or more devices, wherein the circuit parameters include channel length of the one or more devices, width of the one or more devices, and numbers and sizes of drivers and receivers in the input circuit netlist, the classifier trained by using the training set of data comprising each of the one or more extracted circuit patterns as inputs to and expected outputs indicative of the reliability of said each of the one or more extracted circuit patterns of the classifier during training, wherein the reliability about the design of the circuit is to indicate that the circuit netlist contains at least one device that is unreliable to update the design of the circuit to avoid the at least one device that is unreliable.

12. The medium, as in claim 11, wherein the extracting comprises extracting one or more circuit parameters that include one or more structural data or operational data for each of the one or more of the extracted circuit patterns.

13. The medium, as in claim 12, wherein the one or more extracted circuit patterns are stored in a circuit template database, that is used as a training data source to train the classifier.

14. The medium, as in claim 13, wherein the extracting initially extracts an unreliable device and one or more neighboring devices connected to the unreliable device for an initial selection and the extracting extends the initial selection to one or more additional neighboring devices to extract enough to allow recognition of a circuit pattern that is unreliable and resembles the extracted circuit pattern.

15. The medium, as in claim 14, wherein the extension of the initial selection avoids including excess devices that are not needed to distinguish between an unreliable circuit and a similar but reliable circuit.

16. The medium, as in claim 13, wherein the method further comprises:
generating one or more variations of each of the one or more extracted circuit patterns.

17. The medium, as in claim 16, wherein the method further comprises:
pruning at least one of the generated variations.

18. The medium, as in claim 14, wherein the method further comprises:
generating one or more variations of each of the one or more extracted circuit patterns.

19. The medium, as in claim 13, wherein the classifier is of: (1) a neural network; or (2) a random forest of decision trees; or (3) a classifier that is based on a gradient based boosting method or any machine learning based classifier.

20. The medium, as in claim 11, wherein the one or more indicated unreliable devices are unreliable because of one of more of: (1) prone to failure due to electrostatic discharge; (2) prone to failure due to electrical overstress; (3) prone to failure due to aging or electromigration; (4) incorrect bias on one or more devices; (5) excessive over voltage across a junction; or (6) excessive current through a junction or channel or any other reliability issue arising due to a circuit pattern.

21. The medium, as in claim 13, wherein the receiving of outputs occurs (1) serially over time such that simulations for a first circuit netlist are received and processed to train the classifier and then simulations for a second circuit netlist are received and processed to train the classifier, or (2) concurrently from multiple sources of the simulations.

* * * * *